United States Patent [19]

Verret et al.

[11] Patent Number: 4,799,099
[45] Date of Patent: Jan. 17, 1989

[54] BIPOLAR TRANSISTOR IN ISOLATION WELL WITH ANGLED CORNERS

[75] Inventors: Douglas P. Verret, Sugar Land; Jeffrey E. Brighton, Houston; Deems R. Hollingsworth, Missouri City; Manuel L. Torreno, Jr., Harris, all of Tex.

[73] Assignee: Texas Instruments Incorporated, Dallas, Tex.

[21] Appl. No.: 932,752

[22] Filed: Nov. 19, 1986

Related U.S. Application Data

[63] Continuation-in-part of Ser. No. 824,388, Jan. 30, 1986, abandoned.

[51] Int. Cl.$^4$ .................. H01L 27/04; H01L 29/70; H01L 29/46
[52] U.S. Cl. ........................... 357/50; 357/34; 357/59; 357/47
[58] Field of Search .................. 357/47, 49, 50, 59, 357/34

[56] References Cited

U.S. PATENT DOCUMENTS

| | | | |
|---|---|---|---|
| 3,962,779 | 6/1976 | Edwards et al. | 357/92 |
| 4,164,668 | 8/1979 | Delaporte et al. | 357/51 |
| 4,431,460 | 2/1984 | Barson et al. | 357/59 |
| 4,470,062 | 9/1984 | Muramatsu | 357/50 |
| 4,583,106 | 4/1986 | Anantha et al. | 357/59 |
| 4,595,944 | 6/1986 | Antipov | 357/51 |
| 4,611,386 | 9/1986 | Goto | 357/50 |
| 4,631,803 | 12/1986 | Hunter et al. | 357/50 |

OTHER PUBLICATIONS

Barson et al., "Isolated resistor having Doped Polysicon Contacts...", IBM Tech. Discl. Bull., vol. 25, No. 7A, pp. 3585-3586, Dec. 1982.

Primary Examiner—Andrew J. James
Assistant Examiner—John Lamont
Attorney, Agent, or Firm—N. Rhys Merrett; Richard L. Donaldson; Melvin Sharp

[57] ABSTRACT

A bipolar transistor formed on the face of a semiconductor substrate which includes an extrinsic base of a first conductivity type formed in a portion of an emitter-base region of said semiconductor. A conducting base contacting layer is formed over the extrinsic base which has a non-conducting spacer formed over a sidewall thereof. An intrinsic base in the emitter-base region is juxtaposed to the extrinsic base. An emitter of a second conductivity type is formed within the intrinsic base with an edge of the emitter being aligned with an outer edge of the spacer.

19 Claims, 11 Drawing Sheets

BIPOLAR TRANSISTOR IN ISOLATION WELL WITH ANGLED CORNERS

RELATED APPLICATIONS

The present application is a continuation-in-part of application Ser. No. 824,388 filed Jan. 30, 1986, now abandoned.

This application is also related to application Ser. No. 923,454 filed Oct. 27, 1986 which is a continuation-in-part of application Ser. No. 799,042 filed Nov. 18, 1985, now abandoned.

BACKGROUND

The present invention relates to a method of fabrication of a compact high-speed bipolar device in VLSI technology.

The semiconductor industry has sought methods of fabrication to improve the switching speed and reduce the size of bipolar devices. One technique developed in pursuit of this objective is a polysilicon self aligned device. In 1978 Nippon Electric Company of Japan developed a self aligned bipolar device which utilized a local oxide separation method to separate the base region and the N+ emitter published in October, 1978 in "IEEE Journal of Solid State Circuits, Vol. SC-13, No. 5, pp. 693-698 by K. Okada". Oxide Isolation was also used to separate the emitter from the collector. Due to the size constraints of such oxide, the Okada device does not lend itself to significant size reduction.

Fairchild Camera and Instrument as described in U.S. Pat. No. 4,148,468 issued Dec. 6, 1983 by M. Vora used the basic concept of the polysilicon aligned device, except it deposited the N+ polysilicon initially and then grew a thin spacer oxide after which the P+ was deposited. In growing the spacer oxide the base is oxidized making control of the base profile difficult. Further a high temperature oxidation is done to drive the impurities and grow oxide on the p+ polysilicon. Since the oxidation is performed at 1,000° C. It is difficult to keep the base profile shallow using the Vora method. Moreover, oxidation of the P+ results in boron segregation out of the polysilicon into the oxide thus causing a depletion of boron concentration at the polysilicon surface. As with the Okada approach Vora separates the collector from the emitter by isolation oxide.

U.S. Pat. No. 4,481,706 issued Nov. 13, 1984 to M. Roche describes a polysilicon self-aligned device in which the spacer oxide was deposited rather than grown. However, the emitter is formed by an implant and subsequent diffusion of the emitter prior to deposition of polysilicon. Such a method of application makes it difficult to make the junctions very shallow. Furthermore, the base of Roche requires a substantial anneal due to the lateral diffusion required to meet the P+ contact region. In addition, a nitride layer is used in the spacer film thereby complicating the process.

U.S. Pat. No. 4,431,460 issued February 14 to Barson et al. following on with the Roche method optionally omits the nitride from the spacer film. However, Barson retains the same oxide film formed over the p+ polysilicon cap used for the base formation as the sidewall spacer. Using the same difficult to optimally reduce the base resistance, emitter-base capacitance and at the same time maintain a sufficiently high emitter-base breakdown voltage.

Siemens AG published a paper entitled "Self-Aligned Bipolar Technology-New Chances for Very High Speed Digital Integrated Circuits by A Wieder, Siemens Forsch. und Entw. Berichte Bd. 13, 1984, pp. 246-252" which appears to use the same film for the P+ polysilicon cap and the spacer plug. Thus, the latter device would therefore have the same disadvantages as discussed with respect to U.S. Pat. No. 4,431,460.

Accordingly, it is an object of the invention to provide an improved bipolar semiconductor device. It is a further object of the invention to provide an improved bipolar device which exhibits high speed and small dimensions. It is yet another object of the present invention to provide a bipolar semiconductor device which has a significantly smaller emitter to base spacing.

SUMMARY OF THE INVENTION

According to the invention there is provided a bipolar transistor formed on the face of a semiconductor substrate which includes an extrinsic base of a first conductivity type formed in a portion of an emitter-base region of said semiconductor. A conducting base contacting layer is formed over the extrinsic base which has a non-conducting spacer formed over a sidewall thereof. An intrinsic base in the emitter-base region is juxtaposed to the extrinsic base. An emitter of a second conductivity type is formed within the intrinsic base with an edge of the emitter being aligned with an outer edge of the spacer.

Preferably, the transistor includes a buried collector of a second conductivity type, local oxide isolation strips on the face defining the emitter-base region and a separate collector contact area adjacent to the emitter-base region and a trench isolating the transistor from adjacent cells on the semiconductor substrate.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 27:
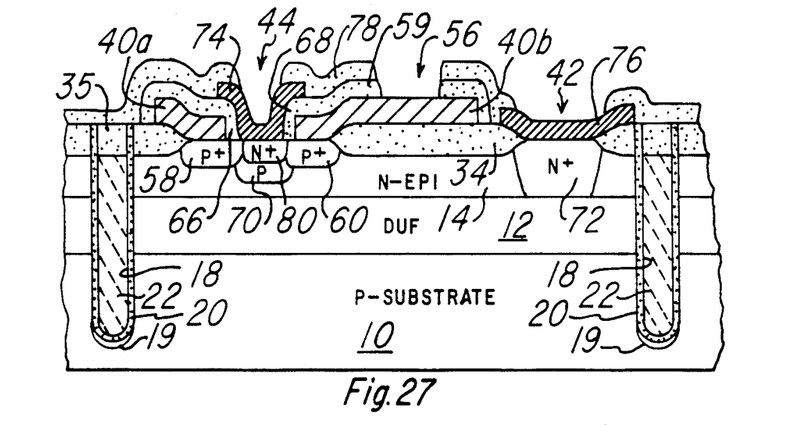

Referring to FIG. 27 there is shown a bipolar transistor cell formed in a P-conductivity type semiconductor substrate 10. The cell is one of many formed on a silicon wafer (not shown) which, in turn, is divided up into a number of chips. Each chip also contains a number of such cells. Each transistor consists of a monocrystalline P-type silicon substrate 10 having an N-type antimony implanted DUF region 12 extending a thickness of 3 to 3.5 microns into the wafer. An N-type epitaxial layer 14 is deposited over the DUF region 12 to a thickness of 1.0 to 1.4 microns. Polysilicon filled trenches 18 each about 1.5 to 2 microns wide and 8 microns deep divide up the substrate 10 and epitaxial layer 14 into a number of regions in which bipolar transistor cells are formed. The sidewalls of each trench 18 are lined with a thin oxide layer 20 and filled with polysilicon 22. A channel stop region 19 is formed at the bottom of each trench 18. The use of a thin oxide layer coupled with polysilicon avoids stress fractures in the silicon and oxide that would otherwise occur with a thick oxide isolation layer.

Figure 31:
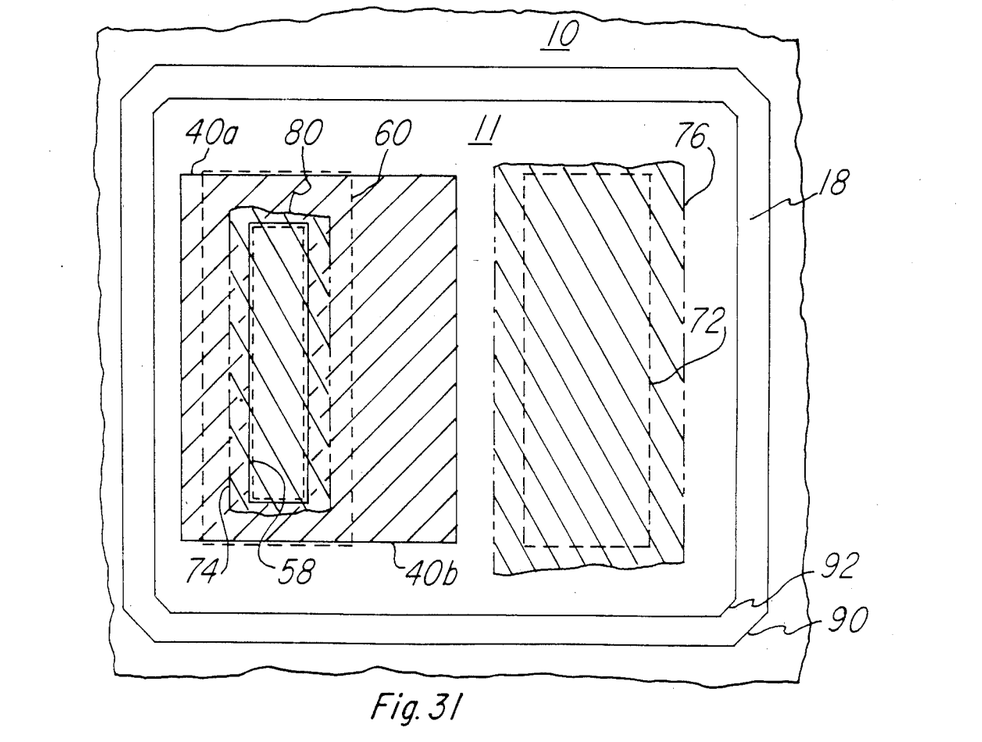
FIG. 31 is a plan view of the structure of FIGS. 27 and 29 after metal has been deposited.

The active area of each transistor cell is formed between a pair of isolation trenches 18 by local oxide isolation the spaces between which define an emitter-base region 44 and a collector contact region 42 (see also FIG. 31). The local oxide isolation areas 34 are grown to approximately 4,000 to 5,000 Angstroms in thickness. During the latter oxidation the top 35 of the polysilicon 22 in each trench 18 is converted to oxide as well. An N+-type conductivity region 72 is formed in the epitaxial layer 14 extending from the DUF region 12 up to the surface of the collector contact area 42. An N-type conductivity polysilicon layer 76 forms the collector contact to region 72.

In the emitter-base region 44 there are developed a pair of spaced apart P+-type regions 58 and 60 formed along each side of region 44 to a depth from the surface of about 1,500 to 5,000 Angstroms. Between the latter regions there is implanted and diffused a P-type conductivity region 70 and then an N+-type conductivity emitter region 80 formed by diffusion from doped polysilicon in the top portion of region 70 to a depth of about 500 to 2,000 Angstroms. Contact to each P+-type region 58 and 60 is provided by P+-type doped amorphous silicon regions 40a and 40b, respectively. A low pressure chemical vapor deposited oxide layer 59 of 3,000 to 5,000 Angstroms thickness covers the regions 40a and 40b and includes sidewall spacers 66 and 68 which space the emitter region 80 from the inactive base regions below regions 40a and 40b, respectively. An N+-conductively type polysilicon layer overlies the emitter 80 between sidewall spacers 66 and 68 to form the emitter contact. A layer of phosphosilicate glass (PSG) 78 is deposited over the oxide 59 and etched to open to emitter contact layer 74, a base contact layer 56 and collector contact layer 76. Metal contacts and interconnects are then deposited and etched (not shown).

Figure 1:
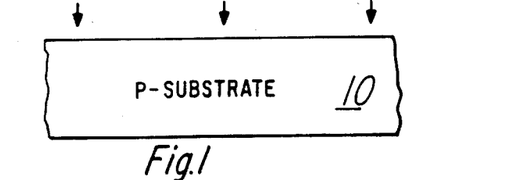
FIGS. 1 to 27 are greatly enlarged sectional elevation views of one cell of a semiconductor chip made in accordance with a preferred embodiment of the invention and showing the device at successive stages of manufacture.
Figure 2:
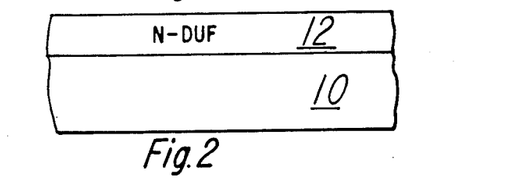
Figure 3:
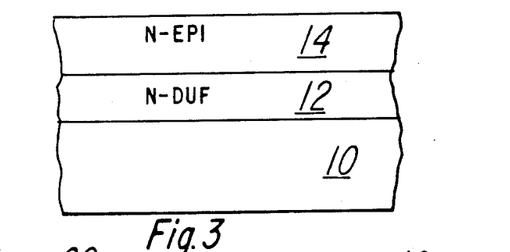

Referring to FIGS. 1 and 2, there is shown a P-type silicon substrate 10 being subjected to a blanket implant of a donor species to a post anneal depth of 3 to 3.5 microns and a final sheet resistance of 10–20 ohms per square. Using antimony as the implanted donor species rather than impurities such as arsenic or phosphorous results in relatively little up diffusion into the overlying epitaxial layer since antimony diffuses much more slowly in silicon than do other types of donor impurities. Consequently, antimony is a preferred dopant species. Next as seen in FIG. 3 an N-type epitaxial layer 14 is deposited over the antimony implanted DUF region 12 at reduced pressure to a thickness of 1.0 to 1.4 microns with resistivity 0.3 to 1.0 ohm-cm. This thickness of epitaxial layer 14 is about 20% less than the thickness of epitaxial layers used in conventional technologies and requires shallow emitter and base regions.

A layer of silicon dioxide 16 is then deposited to a thickness of about 1.0 to 1.5 microns. A layer of photoresist (not shown) is then deposited over the silicon dioxide exposed to ultra violet light through a mask and the exposed portions removed in order to expose trench regions. Depending on the number of cells there may be several such trench regions. The trench region 18 is then etched to form a deep trench extending below the DUF region 12 having a width of 1.5 to 2.0 microns by etching the exposed silicon dioxide. The photoresist is then removed and the silicon is then etched using the silicon dioxide as an etch mask.

Figure 4:
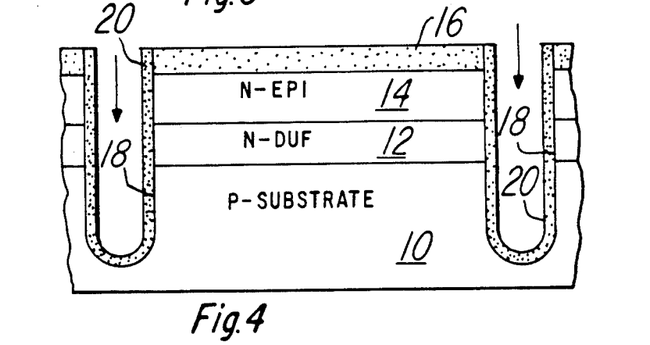
Figure 5:
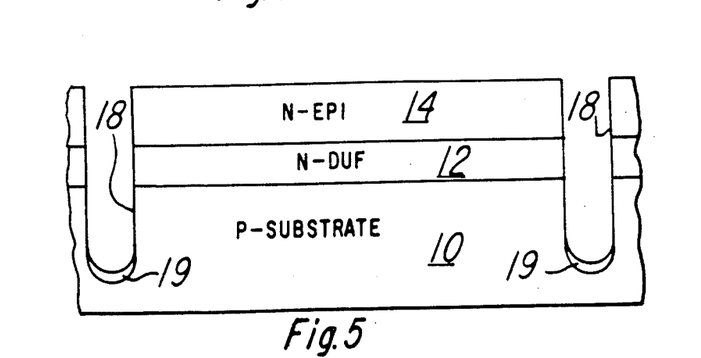
Figure 6:
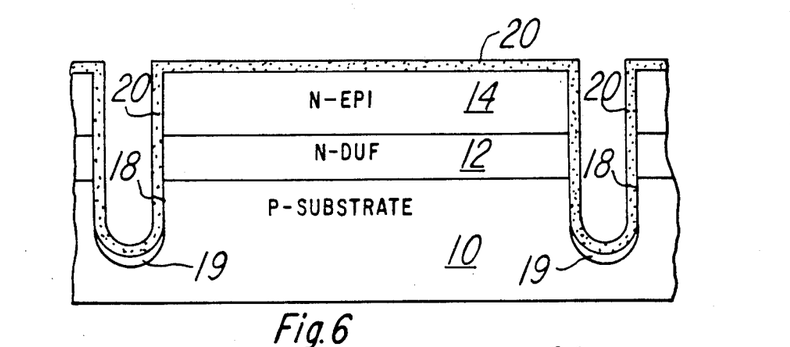

As shown in FIG. 4, a sidewall oxide 13 is grown over the walls of the trenches 18 by placing the cell in an atmosphere of steam at a temperature of approximately 1,000° C. for about 15 minutes. A channel stop boron implant is then directed into the trench 18 at an energy of 40 to 60 keV and a concentration of about $1 \times 10^{14}$ atoms per square centimeter to form a P+ channel stop region 19 below each trench 18 in order to prevent an inversion layer from forming around the trench oxide sidewall 13. An etch removes the layer of silicon dioxide 16 on the surface of the N-epitaxial layer 14 and on the trench sidewalls as shown in FIG. 5. A new layer of sidewall oxide is grown as shown in FIG. 6.

Figure 7:
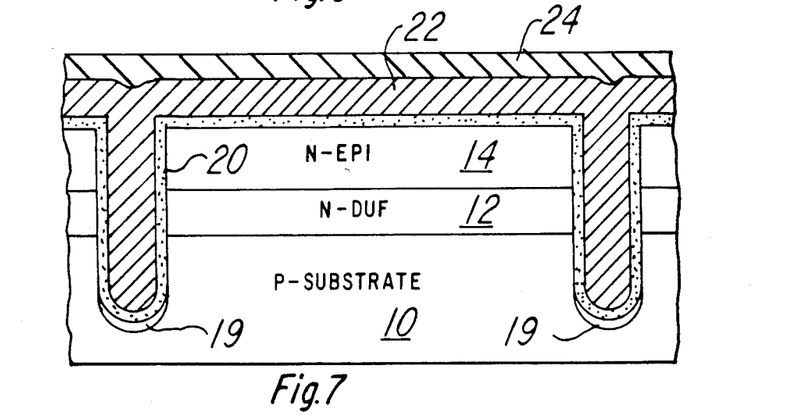
Figure 8:
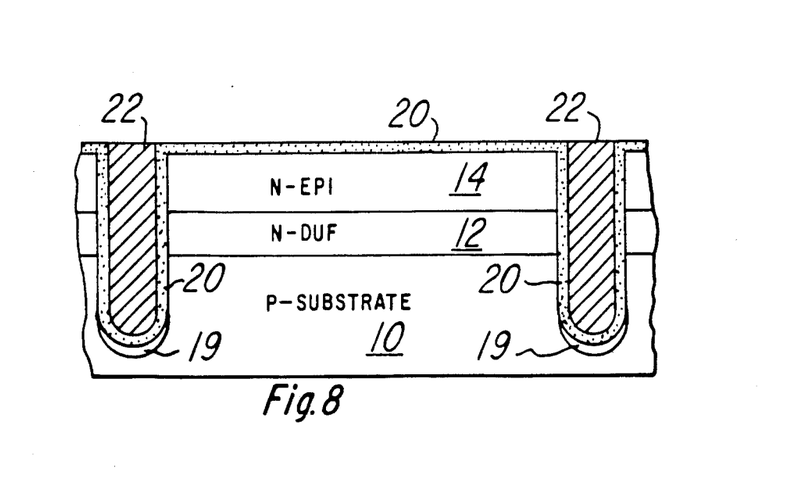

Next the trench 18 are filled with a polysilicon deposit 22 as seen in FIG. 7 and onto the latter layer is deposited a layer of photoresist 24 which is flat. An etch is selected to have an etch rate which will etch the photoresist 24 at substantially the same rate as the underlying polysilicon. Thus, upon etching the photoresist and polysilicon down to the silicon surface 26 a flat oxide surface as seen in FIG. 8 is achieved. By using the active device area present in devices using ordinary oxide isolation is avoided and the packing density can be increased significantly. In oxide isolation the current design rule requires a separation of 8–10 microns between transistors whereas with a polysilicon filled trench the 1.5–2 micron width of the trench is the limit in separation.

Figure 9:
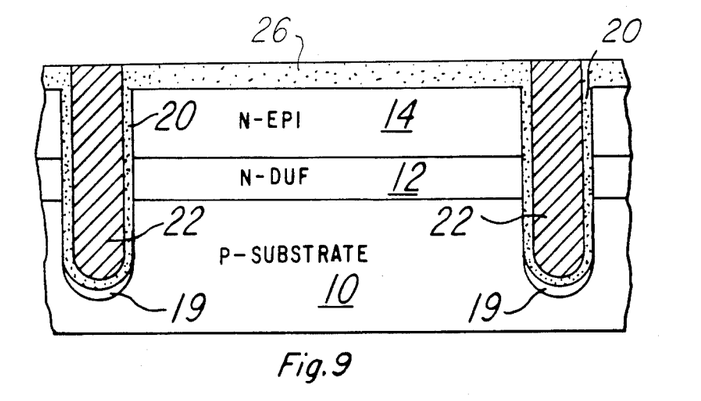
Figure 10:
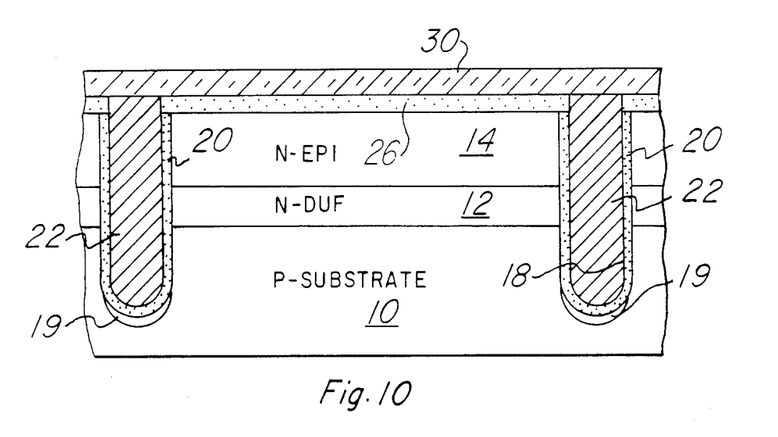
Figure 11:
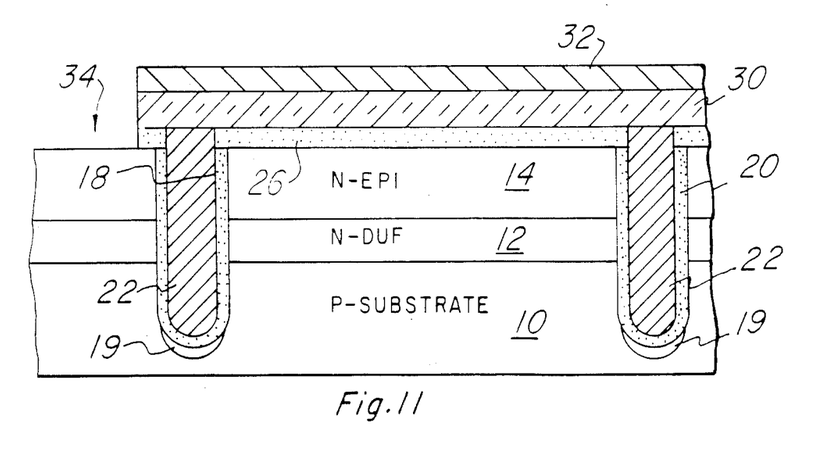
Figure 12:
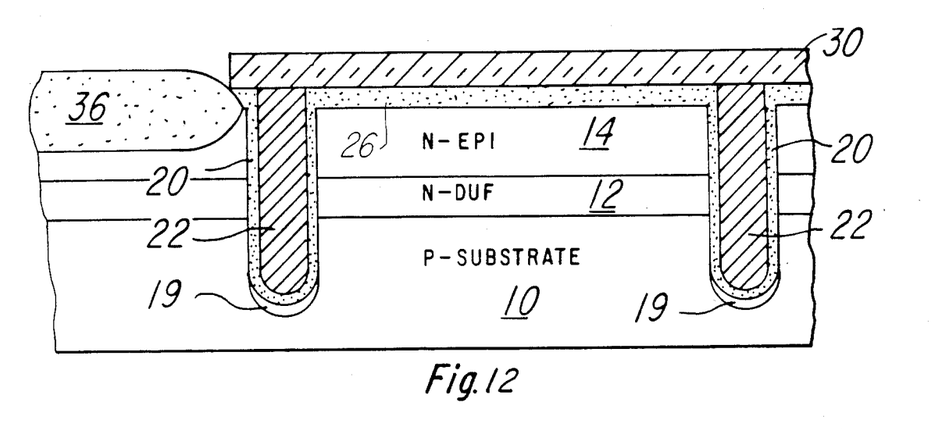

Referring to FIG. 9, the oxide layer 26 is removed with a new oxide layer 28 being grown to a thickness of 800 to 1,200 Angstroms. A layer of silicon nitride 30 is formed over the oxide surface by a low pressure chemical vapour deposition as seen in FIG. 10. A layer of photoresist 32 is deposited over the nitride 30 and then patterned, and the exposed isolation region 34 etched to remove the nitride 30 and oxide 26 as seen in FIG. 11. The entire wafer is then exposed to an oxidizing high pressure atmosphere at about 900° C. for about 2 hours. During oxidation silicon is consumed so that a relatively thick oxidation isolation region 36 is formed as seen in FIG. 12.

Figure 13:
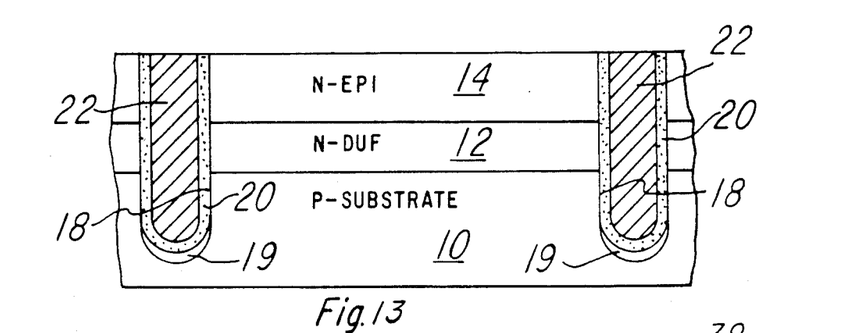
Figure 14:
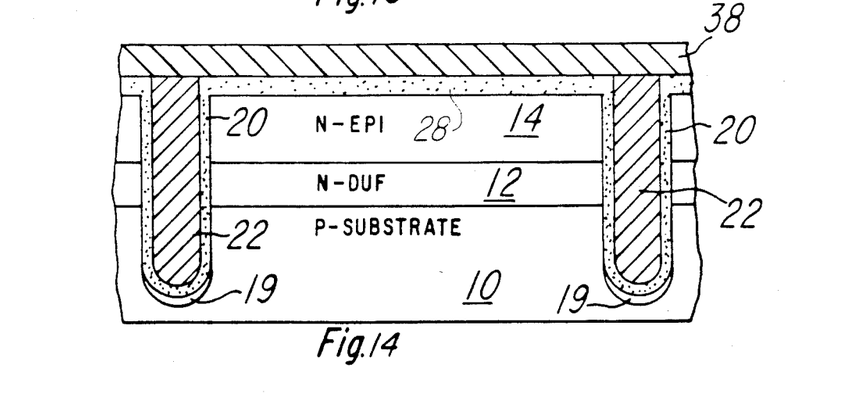
Figure 15:
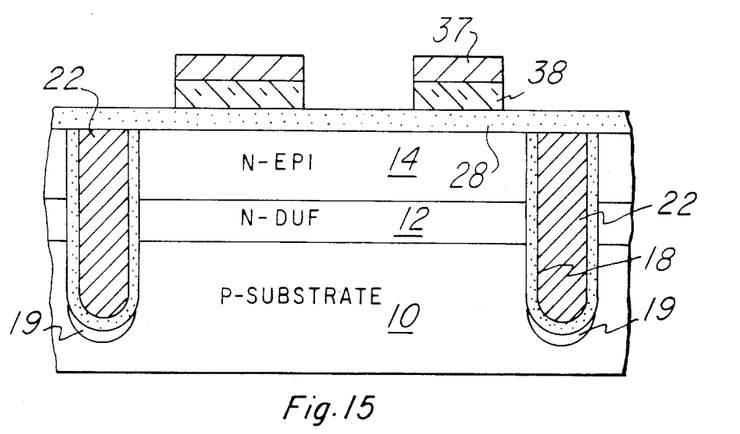
Figure 16:
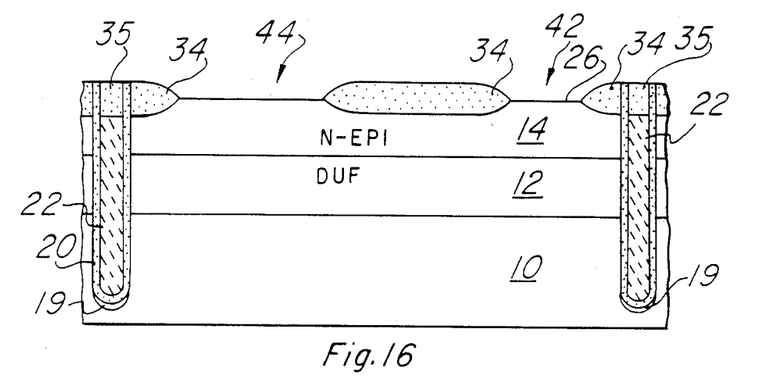

Next, as shown in FIG. 13, the nitride and oxide are etched off. A new layer of oxide 29 is grown to a thickness of 300 to 500 Angstroms and a layer of nitride 38 is deposited by low pressure chemical vapor deposition over the oxide layer 29 to a thickness of 700 to 1,000 Angstroms as shown in FIG. 14. A photoresist layer 37 is then deposited, patterned and developed to expose areas where local oxide isolation strips (LOCOS) are to be formed. The nitride 38 in the opened regions is etched down to oxide layer 29 as shown in FIG. 15. Then oxide 34 is grown in the regions not covered by nitride by again placing the wafer in an oxidizing atmosphere at about 1,000° C. for about 2 hours to form an oxide layer of 3,000 to 5,000 Angstroms thick as shown in FIG. 16. During this step polysilicon 22 at the top of the trench 18 is converted to oxide 35.

Figure 17:
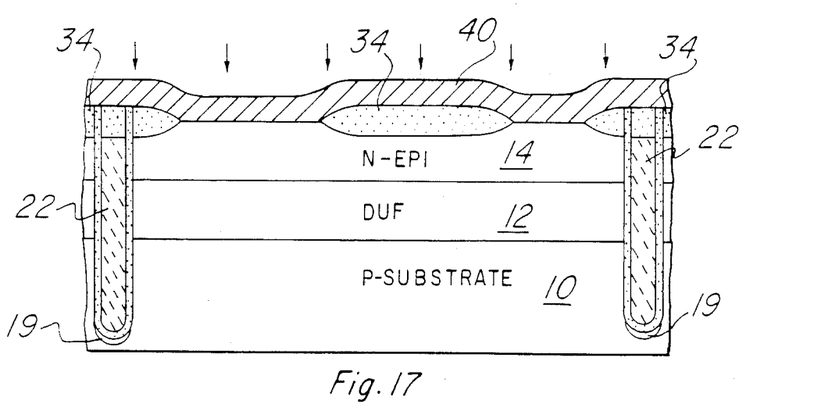
Figure 18:
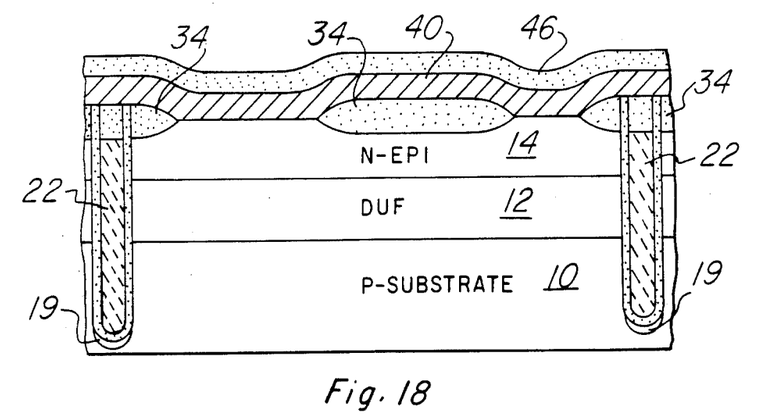
Figure 19:
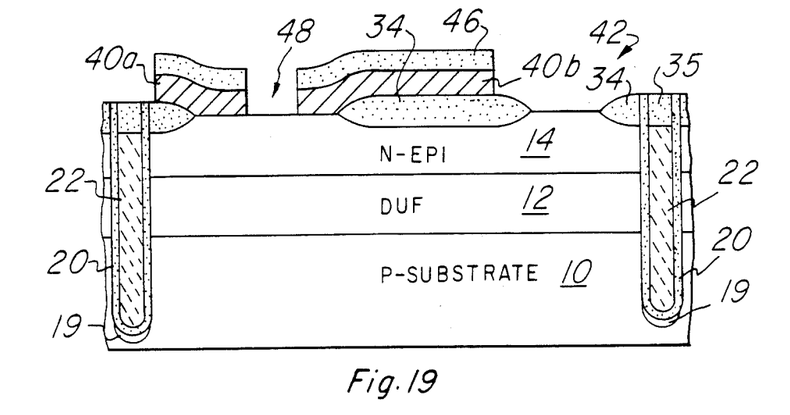
Figure 20:
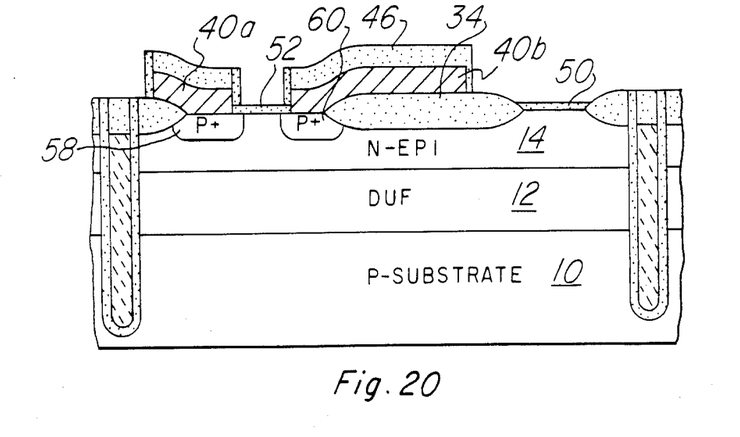
Figure 21:
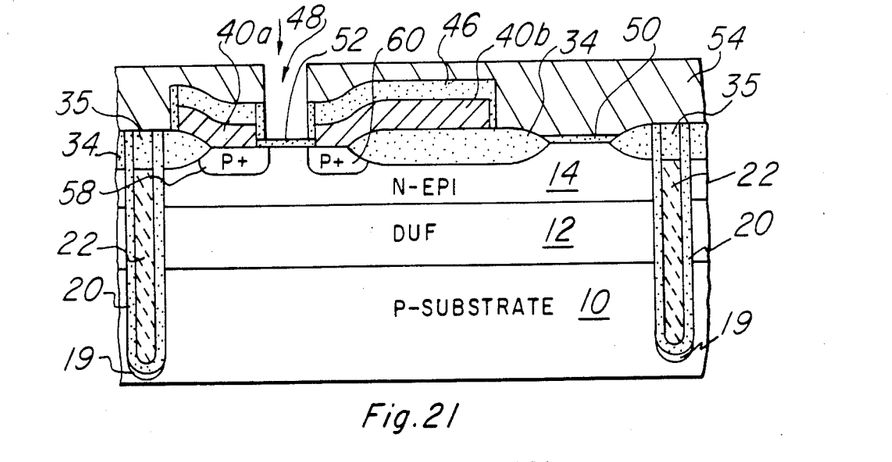

After the nitride 38 and oxide 28 layers are removed, low pressure chemical vapor deposition (LPCVD) is used to deposit a layer of amorphous silicon 40 of 3,000 to 5,000 Angstroms thickness over the entire wafer. The amorphous silicon is then doped with boron to a sheet resistance of 50 to 200 ohms/square as seen in FIG. 17. Amorphous silicon 40 is used rather than polysilicon because of the better etch uniformity of the former. The amorphous silicon 40 is capped with a LPCVD oxide 3,000 to 5,000 Angstroms thick as shown in FIG. 18. The amorphous silicon 40 and oxide 46 are then patterned and etched using photoresist as shown in FIG. 19 to form two stacks 40a and 40b which each overlap the emitter-base region 44. The latter etch is followed by a thin oxidation growth of 800 to 1,500 Angstroms during which boron in the amorphous silicon layers 40a and 40b diffuse into the epitaxial layer 14 to form diffused base areas 58 and 60, respectively, joined at either end as shown in FIG. 31. Following oxidation thin oxide layers 52 and 50 are formed over emitter region 48 and collector contact region 42 as shown in FIG. 20.

Figure 22:
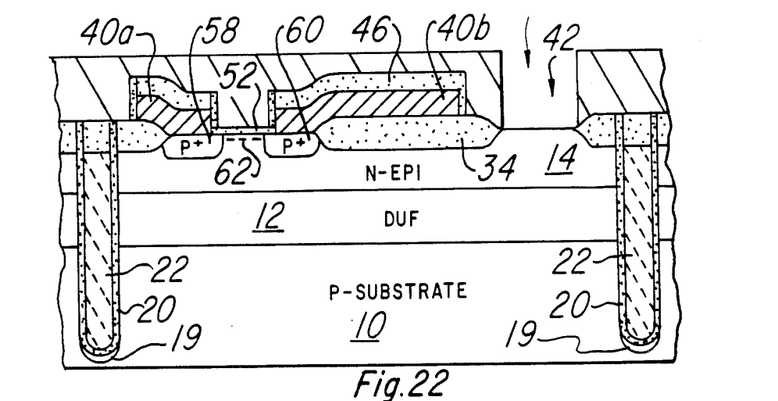
Figure 30:
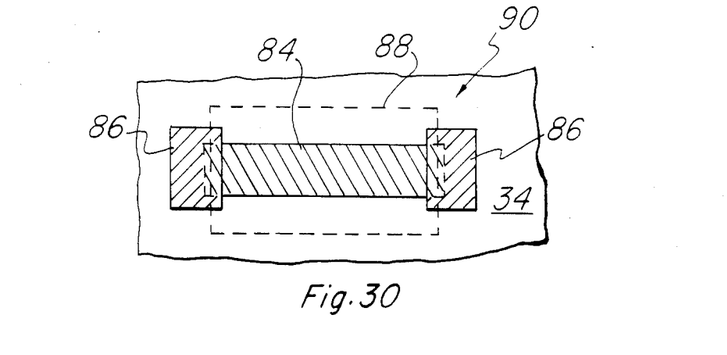
FIG. 30 is a plan view of a resistor fabricated in a separate cell.

Photoresist 54 is deposited and patterned to open a region 48 corresponding to a proposed emitter and intrinsic base region and then an boron implant is made through the thin oxide 52 at an energy of 40 to 60 keV at a concentration suitable to obtain a sheet of 600 to 1,000 ohms per square. Using photoresist patterning a resistor 90 as seen in FIG. 30 of high sheet resistance is also formed by implanting boron at a concentration suitable to obtain a high sheet resistance of 2,000 to 5,000 ohms per square in region 84. The low implant energy and implanting through thin oxide results in a very shallow junction. The collector contact area 42 is defined by photoresist 56 and implanted with phosphorous as seen in FIG. 22. A deep phosphorous implant at an energy of 100–200 keV is effected with a concentration in the range of $4 \times 10^{15}$ to $3 \times 10^{16}$ atoms per square centimeter.

Figure 23:
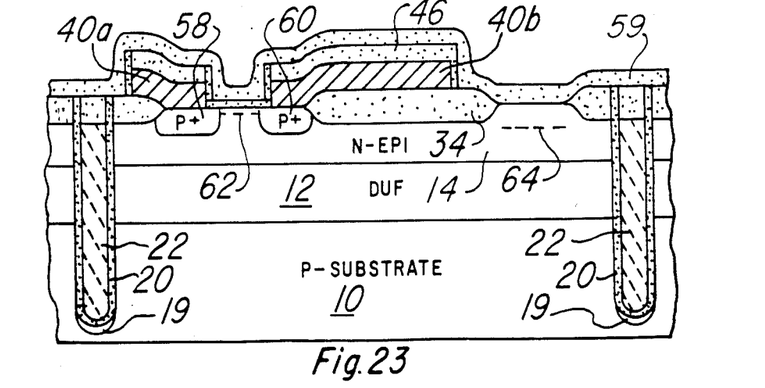
Figure 24:
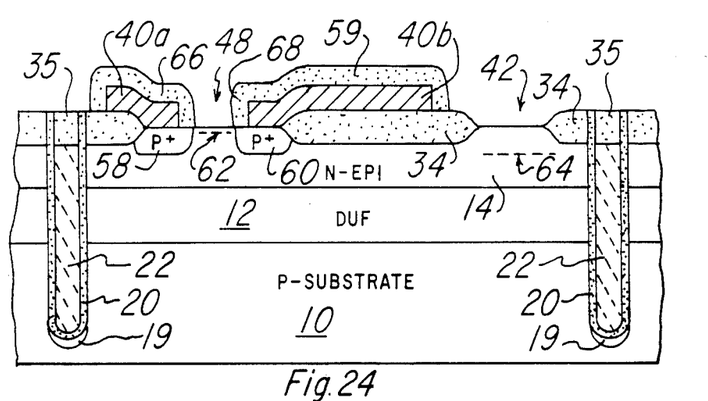
Figure 25:
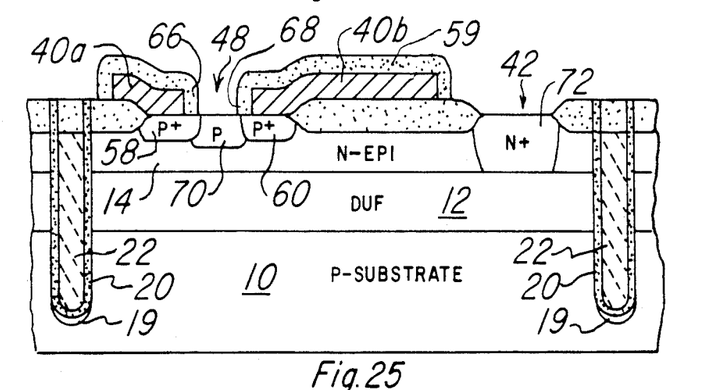
Figure 26:
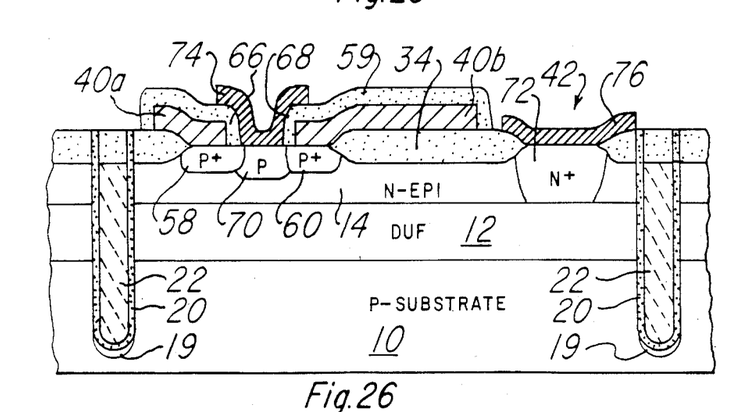

The next process step involves formation of sidewall spacers by first laying down a conformal deposition of LPCVD oxide 59 seen in FIG. 23 which is then etched back with an anisotropic dry etch leaving oxide plugs 66 and 68 on the sidewalls of the oxide/amorphous silicon stacks as seen in FIG. 24. Alternatively, silicon nitride or polysilicon (undoped) can be used in place of oxide 59. The plugs or spacers 66 and 68 define the spacing between the inactive portion of base regions 58 and 60 and the emitter 80 (see FIG. 27). Referring to FIGS. 25 and 26, polysilicon is deposited in emitter opening 48 and collector opening 42. A phosphorous implant is made into the polysilicon at an energy in the range of 80 to 100 keV and at a concentration in the range of $5 \times 10^{15}$ to $2 \times 10^{16}$ atoms per square centimeter. Then the polysilicon is patterned and etched to form emitter 74 and collector 76 contacts as seen in FIG. 26. A layer of phosphosilicate glass (PSG) 78 is then deposited for stabilization and all contacts including base, collector, emitter, resistor contacts and Schottky diodes (not shown) are patterned and etched as seen in FIG. 27.

Figure 28:
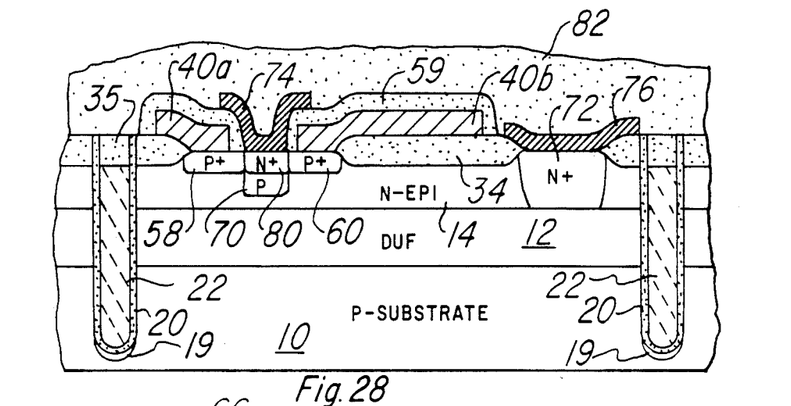
FIGS. 28 and 29 are an alternative planarization method of preparing the contacts for metallization.
Figure 29:
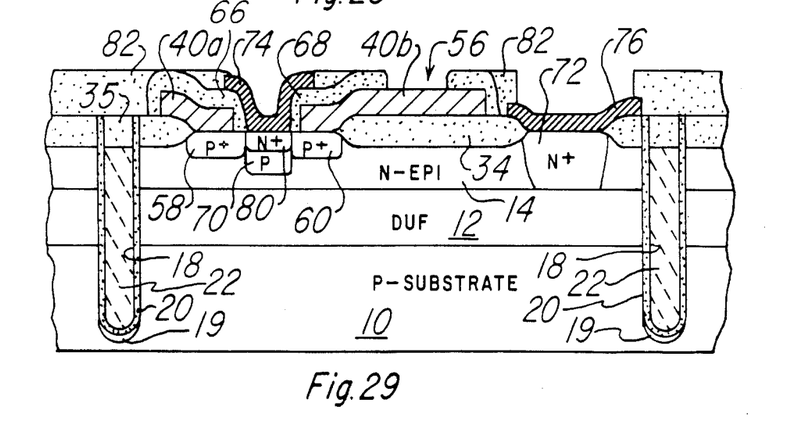

Alternatively, as seen in FIGS. 28 and 29 a thick oxide layer 82 may be deposited after formation of polysilicon contacts 74 and 76 followed by etching to produce a substantially planar top surface and then patterning and etching contacts. Conventional metallization processing is then used to provide interconnects.

A top view of the structure of FIGS. 27 and 29 is shown in FIG. 31. In this case the trench 18 encloses a transistor region 11 on a chip 10. The trench has its sidewalls 90 and 92 at corners angled at 45° with respect to each corresponding intersecting trench sidewall to make the trench width substantially constant at the corners. This is done to avoid voids created in the polysilicon used to fill the trench at corners where no such angles exist.

The extrinsic P+-type base 58 and 60 is seen to form a rectangular ring enclosing N+-type emitter 80. Polysilicon contact 74 engages the emitter 80 while silicon contact 40a and 40b contacts the extrinsic base 58 and 60 on all four sides. Polysilicon layer 76 is shown contacting collector contact N+-type region 72.

Figure 32:
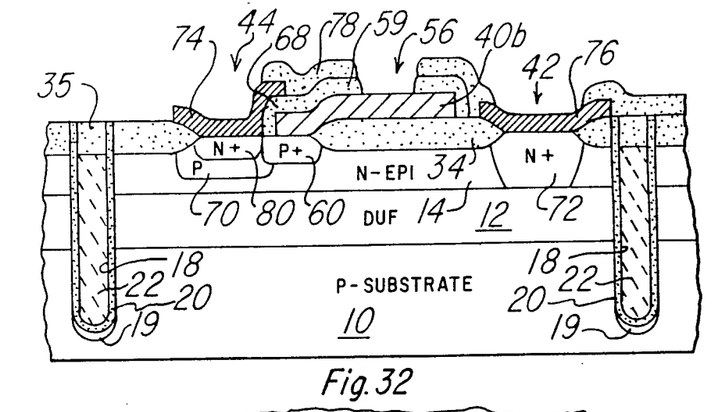
FIG. 32 is an enlarged sectional elevation view of one cell of an alternative embodiment of the invention in which the extrinsic base and contact thereto is one one side as opposed to the four sides shown in FIGS. 28 and 29.
Figure 33:
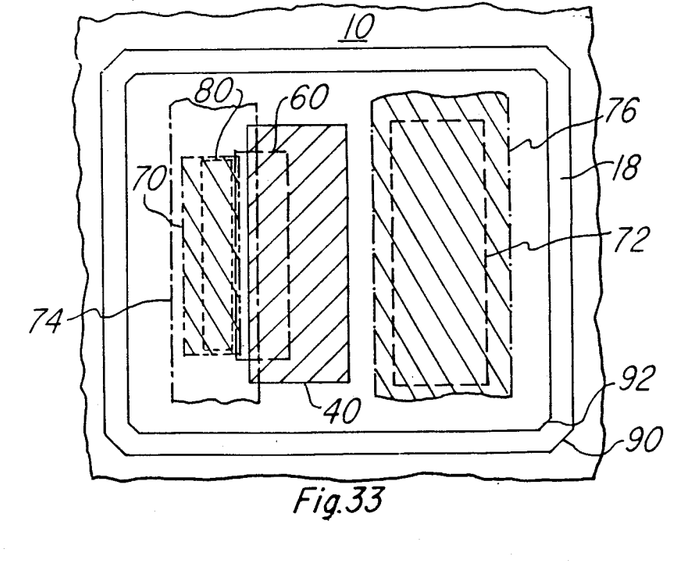
FIG. 33 is a top or plan view of the structure of FIG. 32.

FIGS. 32 and 33 show an alternative scheme in which the amorphous silicon layer 40 and associated extrinsic base 60 extend along only one side of emitter 80.

In addition to a thin epitaxial layer, high switching speed and low base resistance and inherent advantages of the polysilicon emitter, the present device achieves a relatively small collector-base capacitance due to the small inactive base area and shallow P+ junction. Also, the short spacing between the inactive portion of the base and the emitter significantly reduces the base resistance. The minimizing of the former spacing is achieved by utilizing the oxide spacers 66 and 68 to define the separation between the emitter and the inactive portion of the base. Platinum silicide is preferably used between the polysilicon and metal in order to reduce contact resistance.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A bipolar transistor formed on a face of a semiconductor body, comprising:
   local isolation formed at said face to define spaced apart emitter-base and collector contact areas for said transistor, an extrinsic base region doped with impurity of a first conductivity type formed in a portion of said emitter-base area;
   a conductive base contact layer formed over said local isolation and contacting said extrinsic base region, said base contact layer doped with the same impurity as the extrinsic base region and having a non-conductive spacer formed over a sidewall thereof to overlap said emitter-base area;
   an intrinsic base region in said emitter-base area contiguous to said extrinsic base region;
   an emitter region doped with impurity of a second conductivity type formed within said intrinsic base region, said emitter region having an edge adjacent to said extrinsic base region and aligned with an edge of said spacer;
   an emitter contact to said emitter region and separated from the base contact layer by the non-conductive spaces, said emitter contact doped with the same impurity as the emitter region; and isolation means at least partly enclosing said transistor, and comprising a trench extending from said face into the semiconductor body, said trench, viewed in plan, having corners which are angled so that the trench has a substantially constant width.

2. A transistor according to claim 1, including a buried collector region of the second conductivity type extending beneath said emitter-base region.

3. A transistor according to claim 2, including a doped region in said collector contact area for providing electrical contact to said buried collector region.

4. A transistor according to claim 2, wherein said trench extends through said buried collector region.

5. A transistor according to claim 1, wherein said trench surrounds said transistor.

6. A transistor according to claim 5, wherein said trench is coated with a thin oxide layer and has a polysilicon filler.

7. A transistor according to claim 5, including a channel stop region below said trench.

8. A transistor according to claim 2, wherein said emitter region is N-type, said base region is P-type and said collector region is N-type.

9. A transistor according to claim 1, wherein said emitter contact and said base contact layer comprise impurity doped polysilicon.

10. A bipolar transistor formed at the face of a semiconductor substrate of a first conductivity type comprising: a buried collector region of a second conductivity type;
an epitaxial collector layer having a second conductivity type over said collector region;
a local isolation region on the epitaxial layer laterally separating an emitter-base area from a collector contact area, said local isolation region extending into but not through said epitaxial layer; a base contact layer doped with impurity of a first conductivity type overlying a portion of said emitter-base area;
an extrinsic base region of the first conductivity type in said epitaxial layer beneath said base contact layer and doped with the same impurity as said base contact layer;
an intrinsic base region of the first conductivity type formed in said epitaxial layer contiguous to said extrinsic base region; an emitter region of a second conductivity type formed in said intrinsic base region;
an insulating spacer on a sidewall of said base contact layer which aligns said emitter region relative to said base region;
an emitter contact layer abutting said oxide spacer and doped with the same impurity as the emitter region; and
an isolating trench at least partly enclosing the transistor, said trench, viewed in plan, having corners that are angled so that the trench has a substantially constant width.

11. A transistor according to claim 10, wherein said base contact layer comprises silicon doped with boron and has a sheet resistance in the range of 50 to 150 ohms/square.

12. A transistor according to claim 11, wherein said emitter contact layer is polysilicon doped with phosphorous to a concentration in the range of $5 \times 10^{15}$ to $2 \times 10^{16}$ atoms per square centimeter.

13. A transistor according to claim 11, wherein said emitter contact layer is polysilicon doped with arsenic.

14. A transistor according to claim 10, wherein said epitaxial layer has a thickness in the range of 1.0 to 1.4 microns; said emitter region has a depth in the range of 1,000 to 2,000 Angstroms; said base region has a depth in the range of 3,000 to 5,000 Angstroms; and said buried collector region has a thickness in the range of 3 to $3\frac{1}{2}$ microns.

15. A transistor according to claim 14, including a resistor region in said epitaxial layer having a sheet resistivity of 3,000 to 5,000 ohms per square.

16. A transistor according to claim 15, wherein ends of said resistor region are covered with doped polysilicon contacts.

17. A bipolar transistor formed at the face of a semiconductor body, comprising:
an intrinsic base region doped with impurity of a first conductivity type formed in an emitter-base area of said semiconductor body;
a polysilicon base contact layer overlying and contacting an extrinsic base region in said emitter-base area said polysilicon layer and extrinsic base region each doped with the same impurity of said first conductivity type;
an insulating oxide sidewall spacer formed on a sidewall of said polysilicon layer in said emitter-base area;
an emitter region doped with impurity of a second conductivity type within said intrinsic base region, an edge of said emitter region aligned with an edge of said spacer;
a polysilicon emitter contact doped with the same impurity as the emitter region and contacting the emitter region said emitter contact separated from said base contact layer by said insulating oxide sidewall spacer;
a buried collector region in said semiconductor body extending under said base-emitter area beneath an epitaxial layer of said second conductivity type which defines said face of the semiconductor body, and a doped collector connection region extending from said face of the semiconductor body to the buried collector region;
an insulating oxide layer extending into but not through the epitaxial layer to define the emitter-base area, providing isolation between said emitter-base area and said doped collector connection region, and accommodating said base contact layer and said emitter contact within the emitter-base area; and
a trench extending from said face of the semiconductor body through the epitaxial layer and the buried collector region to at least partly enclose said transistor; said trench having an oxide sidewall coating and a polysilicon filler; and said trench, when viewed in plan, having corners that are angled so that the trench has a substantially constant width.

18. A transistor according to claim 17, wherein said trench has a width in the range of 1.5 to 2.0 microns and a depth in the range of 6 to 10 microns.

19. A transistor according to claim 17, wherein the thickness of said epitaxial layer does not exceed about 1.4 microns; said extrinsic base region has a depth not exceeding about 5000 Angstroms; and said emitter region has a depth not exceeding about 2000 Angstroms.

* * * * *